United States Patent
Hasegawa

[11] Patent Number: 6,035,312
[45] Date of Patent: Mar. 7, 2000

[54] ADAPTIVE FILTER

[75] Inventor: Atsushi Hasegawa, Tokyo, Japan

[73] Assignee: NEC Corporation, Tokyo, Japan

[21] Appl. No.: 09/023,788

[22] Filed: Feb. 13, 1998

[30] Foreign Application Priority Data

Feb. 13, 1997 [JP] Japan .................................... 9-044755

[51] Int. Cl.$^7$ ................................................ G06F 17/10
[52] U.S. Cl. .......................................... 708/322; 708/319
[58] Field of Search .................................. 708/322–323, 708/319

[56] References Cited

U.S. PATENT DOCUMENTS

| | | | |
|---|---|---|---|
| 5,001,701 | 3/1991 | Gay | 370/32.1 |
| 5,050,119 | 9/1991 | Lish | 708/319 |
| 5,222,035 | 6/1993 | Nakase et al. | 708/319 |
| 5,245,561 | 9/1993 | Sugiyama | 708/319 |
| 5,777,910 | 7/1998 | Lu | 708/323 |

FOREIGN PATENT DOCUMENTS

| | | |
|---|---|---|
| 62-65515 | 3/1987 | Japan . |
| 62-82729 | 4/1987 | Japan . |
| 1-256821 | 10/1989 | Japan . |
| 3-92018 | 4/1991 | Japan . |
| 3-143035 | 6/1991 | Japan . |
| 3-266516 | 11/1991 | Japan . |
| 4-30621 | 2/1992 | Japan . |
| 4-245810 | 9/1992 | Japan . |

OTHER PUBLICATIONS

"Adaptive Signal processing", Adaptive Algorithms and Structures, Part III, (Chapters 6–8) Prentice–Hall, 1985, pp. 98–103.

"A Learning Method for System Identification", by A. Noda et al., Keysoku to Seigyo, vol. 7, No. 9, Sep. 1968, pp. 597–605.

*Primary Examiner*—Tan V. Mai
*Attorney, Agent, or Firm*—Sughrue, Mion, Zinn Macpeak & Seas, PLLC

[57] ABSTRACT

An adaptive filter includes n (n is a positive integer) blocks, m filter circuits, a matrix switch, an adder, and a controller. The blocks divide a continuous string of a plurality of input signals into a plurality of groups each made up of k (k is a positive integer) signals. The filter circuits variably set a filter coefficient on the basis of a reference signal, an error signal representing a difference between a filter output and an output from a system to be estimated, and a constant, and output the calculation results of the set filter coefficient and the reference signal. The matrix switch selects m blocks from the n blocks to respectively connect the selected blocks to the filter circuits, and outputs output signals of the selected blocks as reference signals to the connected filter circuits. The adder calculates the sum of calculation results output from the filter circuits, and outputs it as a filter output. The controller controls a connection operation of the matrix switch on the basis of each filter coefficient set in the filter circuit.

9 Claims, 8 Drawing Sheets

ADAPTIVE FILTER

BACKGROUND OF THE INVENTION

The present invention relates to a circuit for estimating an unknown system using an adaptive filter and, more particularly, to an adaptive filter suitably applied to an echo canceller for canceling an echo which poses problems on a relatively long line with a transmission path delay accompanied by 2-to-4-wire conversion.

In system identification using an adaptive filter, in order to estimate an output signal y(t) from a system by referring to a signal x(t) input to this system, the coefficient wi(t) of the adaptive filter is updated using a difference e(t)=(ŷ(t)−y(t)) between an output ŷ(t) from the adaptive filter and the output y(t).

More specifically, a conventional method of canceling a reflected signal (echo) generated in 2-to-4-wire conversion serving as a target system will be described by exemplifying a learning identification method used in an echo canceller as a system identification method. This learning identification method is described in, e.g., Noda and Nagumo, "A Learning Method for System Identification", Measurement and Control, Vol. 7, No. 9, pp. 597–605, September, 1968 (reference 1).

Assuming an adaptive FIR filter with N taps, a pseudo echo ŷ(t) as a filter output at time t is calculated from equation (1):

$$\hat{y}(t) = \sum_{i=0}^{N-1} w_i(t) \times (t-i) \quad (1)$$

where wi(t) is the ith filter coefficient at time t, and x(t) is the reference signal at time t.

The pseudo echo ŷ(t) in equation (1) is subtracted from the echo signal y(t) at time t to cancel an echo, as given by equation (2):

$$e(t)=y(t)-\hat{y}(t) \quad (2)$$

The filter coefficient wi(t) is updated by equation (3) so as to minimize the residual signal e(t) in equation (2):

$$wi(t+1)=wi(t)+\mu(t)e(t)\times(t-i) \quad (3)$$

The step size μ(t) in equation (3) is given by equation (4):

$$\mu(t)=\mu 0/PX(t) \quad (4)$$

where μ0 is a positive constant which influences the convergence speed, and PX(t) is the power of the reference signal and given by equation (5):

$$Px(t) = \sum_{i=0}^{N-1} x^2(t-i) \quad (5)$$

As represented by equations (1) to (5), generation of the pseudo echo, calculation of the power of the reference signal, and update of the filter coefficient require the calculation amount proportional to N and memories used by the calculation.

An LMS (Least Mean Square) algorithm such as the learning identification method is known to have a low convergence speed proportional to N (see, e.g., "The LMS Algorithm", Adaptive Signal Processing (part III, "Adaptive Algorithms and Structures"), pp. 99–103, Prentica-Hall, 1985 (reference 2)).

On the other hand, a "responding part" (also referred to as a "waveform responding part") of an impulse response on an echo path is only part of the entire impulse response, as shown in FIG. 8. FIG. 8 shows an example of the impulse response on the echo path by plotting the time on the abscissa and the magnitude on the ordinate.

To cancel an echo, the "responding part" must be estimated using the filter coefficients of the N taps (blocks) of the adaptive filter. In general, however, the location of the "responding part" is unknown, so the largest value is assumed to determine the value N. For this reason, the adaptive filter practically has the filter coefficient of a "fixed delay part" and a filter coefficient subsequent to the "responding part" that converges to "0" (zero). The filter coefficient that converges to "0" need not be processed by equations (1) and (3) and considered.

Wasteful processing can be eliminated by classifying the respective taps into taps (to be referred to as effective taps or blocks hereinafter) for performing calculation associated with the filter, and taps (to be referred to as ineffective taps or blocks hereinafter) for not performing any calculation.

For example, Japanese Patent Laid-Open No. 4-245810 (reference 3) discloses a method in which effective taps are intensively arranged at a "responding part" to increase the convergence speed and decrease the number of memories. That is, reference 3 proposes a system for an adaptive filter in a method and device for estimating system characteristics wherein the convergence time is shortened by changing the rearrangement number of tap locations in assigning the limited number of taps to the actual waveform responding part of an impulse response.

FIG. 6 shows a system characteristic estimating device proposed in reference 3. In FIG. 6, input signals 901 are input parallel as N successive data x(t), . . . , x(t−N+1) to a matrix switch 905 through (N−1) delay elements $909_1$ to $909_N$. Upon reception of an instruction from a controller 906, the matrix switch 905 connects taps to M (M<N) tap circuits $910_1$ to $910_m$. Taps connected to tap circuits at this time are called "effective taps", and taps not connected are called "ineffective taps".

The tap circuits $910_1$ to $910_M$ calculate equation (3) using input signals x(t−i) (M signals satisfying 0<i<N−1), an error signal e(t) as an output from a subtracter 904 obtained by subtracting an output ŷ(t) of an adaptive filter 920 from an output y(t) of an unknown system 930 including a hybrid transformer 903, and a constant μ.

An adder 908 adds outputs from the tap circuits $910_1$ to $910_M$ in accordance with equation (1) to obtain an output from the adaptive filter 920.

In the above-mentioned conventional system, connection of taps to the tap circuits is switched by the matrix switch 905 in units of taps. For this purpose, the controller 906 for controlling switching of the connection by the matrix switch 905, monitors and orders outputs (to be referred to as filter coefficients hereinafter) from the coefficient generators of the tap circuits $910_1$ to $910_M$.

FIG. 7 shows the arrangement of the controller 906 shown in FIG. 6. The role of the controller 906 is to select effective taps, as described above. In other words, the controller 906 selects a tap to be switched from "effective" to "ineffective" and a tap to be switched from "ineffective" to "effective" in exchanging effective and ineffective taps.

In FIG. 7, a selector 954 selects one signal from M signals 951 input from the tap circuits $910_1$ to $910_M$. A minimum value monitoring circuit 970 made up of a comparator 956 and a memory circuit 957 determines whether the power of the selected signal is minimum. In the minimum value monitoring circuit 970, the memory 957 stores the minimum value and a corresponding effective tap number. The comparator 956 compares an output from an absolute value circuit 955 for calculating the absolute value of the signal selected by the selector 954 with the minimum value stored in the memory 957 in accordance with the effective tap number.

At the timing of a timing circuit 962, a selector 959 exchanges the effective tap number output from the minimum value monitoring circuit 970 and stored in a FIFO (First-In First-Out) memory 958, and an output from a delay element 960 storing an ineffective tap number. An output from the selector 959 is stored in a memory 961 and used as a control signal for the matrix switch 905.

In realizing the adaptive filter, there are three important subjects, i.e., the hardware scale, the calculation amount, and the convergence speed. The above conventional technique suffers the following problems.

First, the calculation amount is large owing to the following reason. In the conventional technique, selection of "effective" and "ineffective" taps is performed in units of taps, and thus determination processing must be performed within a short time because the filter coefficient greatly varies every estimation calculation.

To compare filter coefficients, processing must be performed for N filter coefficients in a time interval between one estimation calculation and the next estimation calculation. To distribute this processing, a filter coefficient at a certain timing must be stored, or the estimation calculation must be stopped. However, the storage of the filter coefficient leads to a large hardware scale, and the stop of the estimation calculation results in a low convergence speed.

To perform processing without any distribution, it must be performed for M filter coefficients at a sample interval in which a signal is input, and the calculation amount inevitably increases (high-speed processing is required).

Second, the estimation processing is unstable due to the following reason. In the conventional technique, since control is performed in units of taps, a tap is determined to be "ineffective" even at the "responding part" of the impulse response. Stably performing the estimation processing requires complicated processing such as "calculation of the variance".

SUMMARY OF THE INVENTION

It is an object of the present invention to provide an adaptive filter having a small hardware scale and a high convergence speed.

It is another object of the present invention to provide an adaptive filter having a small calculation amount.

In order to achieve the above objects, according to the present invention, there is provided an adaptive filter comprising: n (n is a positive integer) blocks for dividing a continuous string of a plurality of input signals into a plurality of groups each made up of k (k is a positive integer) signals; m filter means for variably setting a filter coefficient on the basis of a reference signal, an error signal representing a difference between a filter output and an output from a system to be estimated, and a constant, and outputting a calculation result of the set filter coefficient and the reference signal; a matrix switch for selecting m blocks from the n blocks to respectively connect the selected blocks to the filter means, and outputting output signals of the selected blocks as reference signals to the connected filter means; addition means for calculating a sum of calculation results output from the filter means; and outputting the sum as a filter output, and control means for controlling a connection operation of the matrix switch on the basis of each filter coefficient se in the filter means.

DESCRIPTION OF THE PREFERRED EMBODIMENT

The present invention will be described in detail below with reference to the accompanying drawings.

Figure 1:
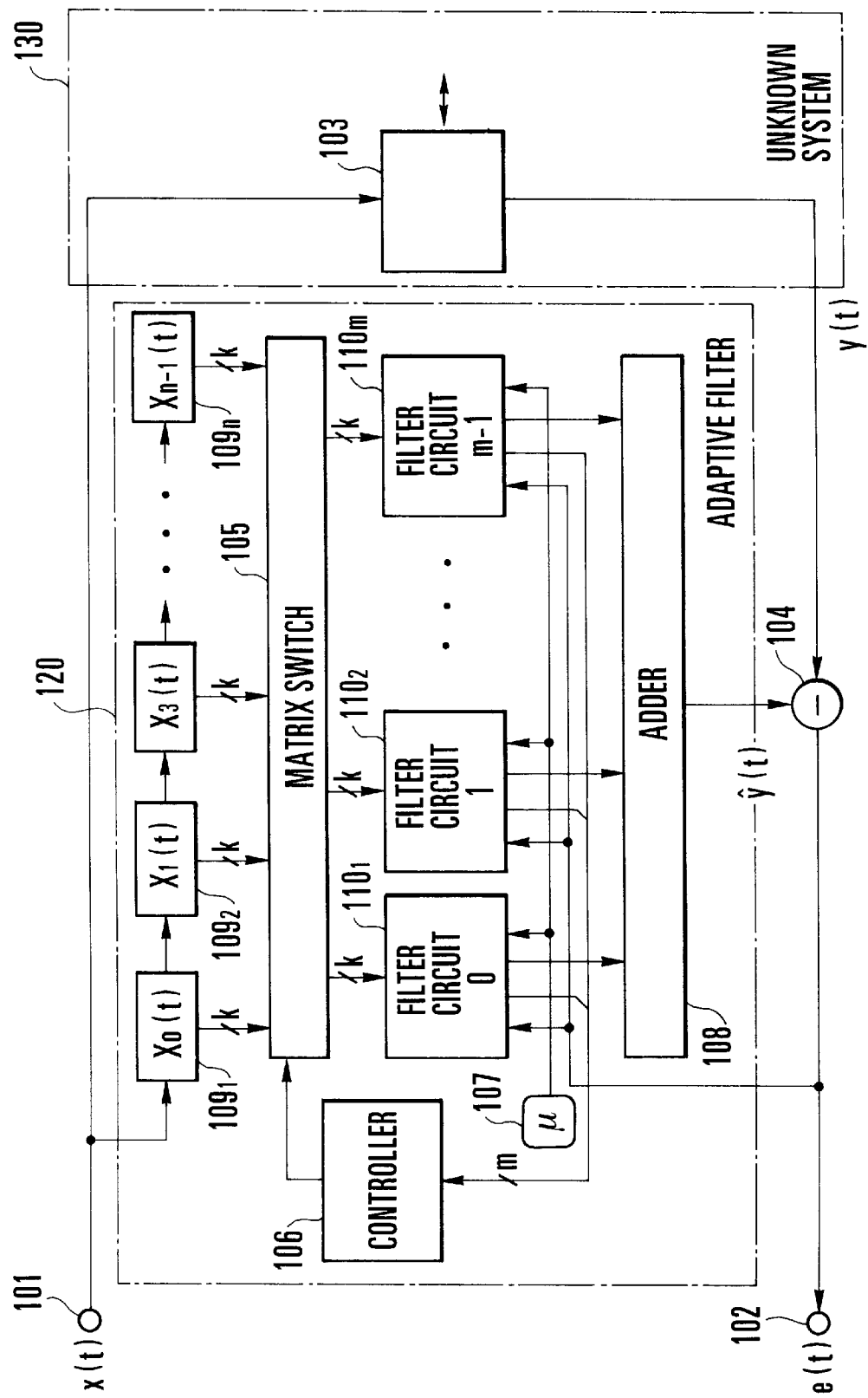
FIG. 1 is a block diagram showing the construction of an echo canceller system having an adaptive filter according to an embodiment of the present invention.

FIG. 1 shows an echo canceller system having an adaptive filter according to an embodiment of the present invention. In FIG. 1, an adaptive filter 120 of this embodiment comprises n input signal blocks $109_1$ to $109_1$ each for outputting a plurality of (=k) signals from reference input signals 101, m (m<n) filter circuits $110_1$ to $110_m$ each having k filter coefficients, and a matrix switch 105 for connecting the input signal blocks $109_1$ to $109_n$ to the filter circuits $110_1$ to $110_m$. Of the input signal blocks $109_1$ to $109_n$, input signal blocks connected to filter circuits are called "effective blocks", and blocks not connected to filter circuits are called "ineffective blocks".

The adaptive filter 120 further comprises a controller 106 for monitoring information about the filter coefficients of the filter circuits $110_1$ to $110_m$ and performing selection or exchange of effective and ineffective blocks, and an adder 108 for calculating the sum of outputs from the filter circuits $110_1$ for $110_m$ to use as an output from the adaptive filter. A subtracter 104 cancels an echo by subtracting the output signal of the adaptive filter 120 from an output signal of an unknown system 130 including a hybrid transformer 103 that is subjected to system identification.

Figure 2:
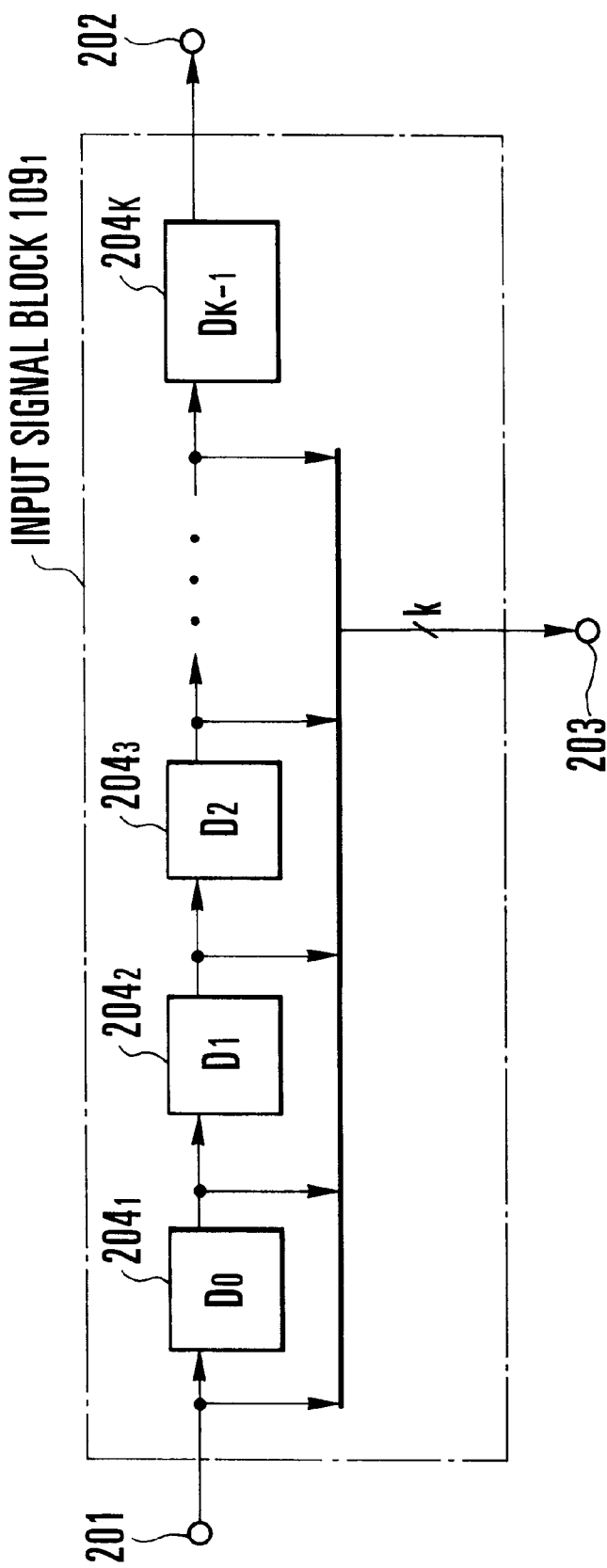
FIG. 2 is a block diagram showing the arrangement of an input signal block in FIG. 1.

FIG. 2 shows the input signal block $109_1$ in FIG. 1 in detail. The input signal blocks $109_1$ to $109_m$ have the same arrangement. In FIG. 2, the input signal block $109_1$ is constituted by a plurality of delay elements $204_1$ to $204_k$ cascade-connected to each other to sequentially delay an input signal 201, an output terminal 202 for outputting a signal of the delay element $204_k$ on the last stage, and an output terminal 203 for outputting all the (k) input signals of the delay elements $204_1$ to $204_k$ in parallel.

Figure 3:
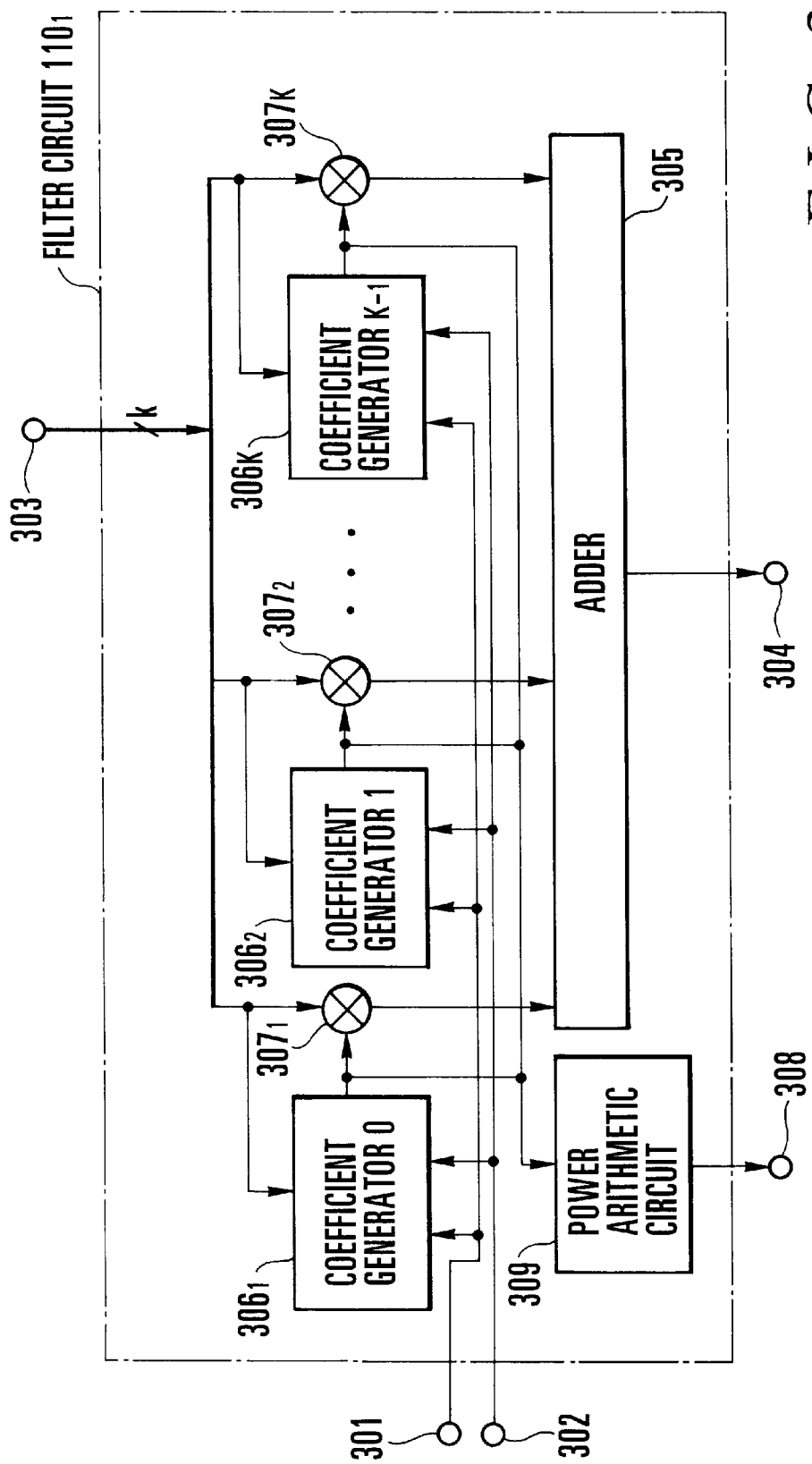
FIG. 3 is a block diagram showing the arrangement of a filter circuit in FIG. 1.

FIG. 3 shows the filter circuit $110_1$ in FIG. 1. The filter circuits $110_1$ to $110_m$ have the same arrangement. In FIG. 3, the filter circuit $110_1$ is constituted by an input terminal 301 for inputting an error signal, an input terminal 302 for inputting a coefficient necessary for generating a filter coefficient, an input terminal 303 for inputting the k reference input signals, coefficient generators $306_1$ to $306_k$ for generating filter coefficients from the error signal, the coefficient, and the reference input signals, multipliers $307_1$ to $307_k$ for multiplying outputs from the coefficient generators $306_1$ to $306_k$ by the reference input signals, an adder 305 for calculating the sum of outputs from the multipliers $307_1$ to $307_k$, an output terminal 304 for outputting an output from the adder 305 as a filter output, a filter coefficient power arithmetic circuit 309 for calculating the sum of filter coefficient powers from the outputs of the coefficient generators $306_1$ to $306_k$, and an output terminal 308 for outputting the obtained filter coefficient power.

Figure 4:
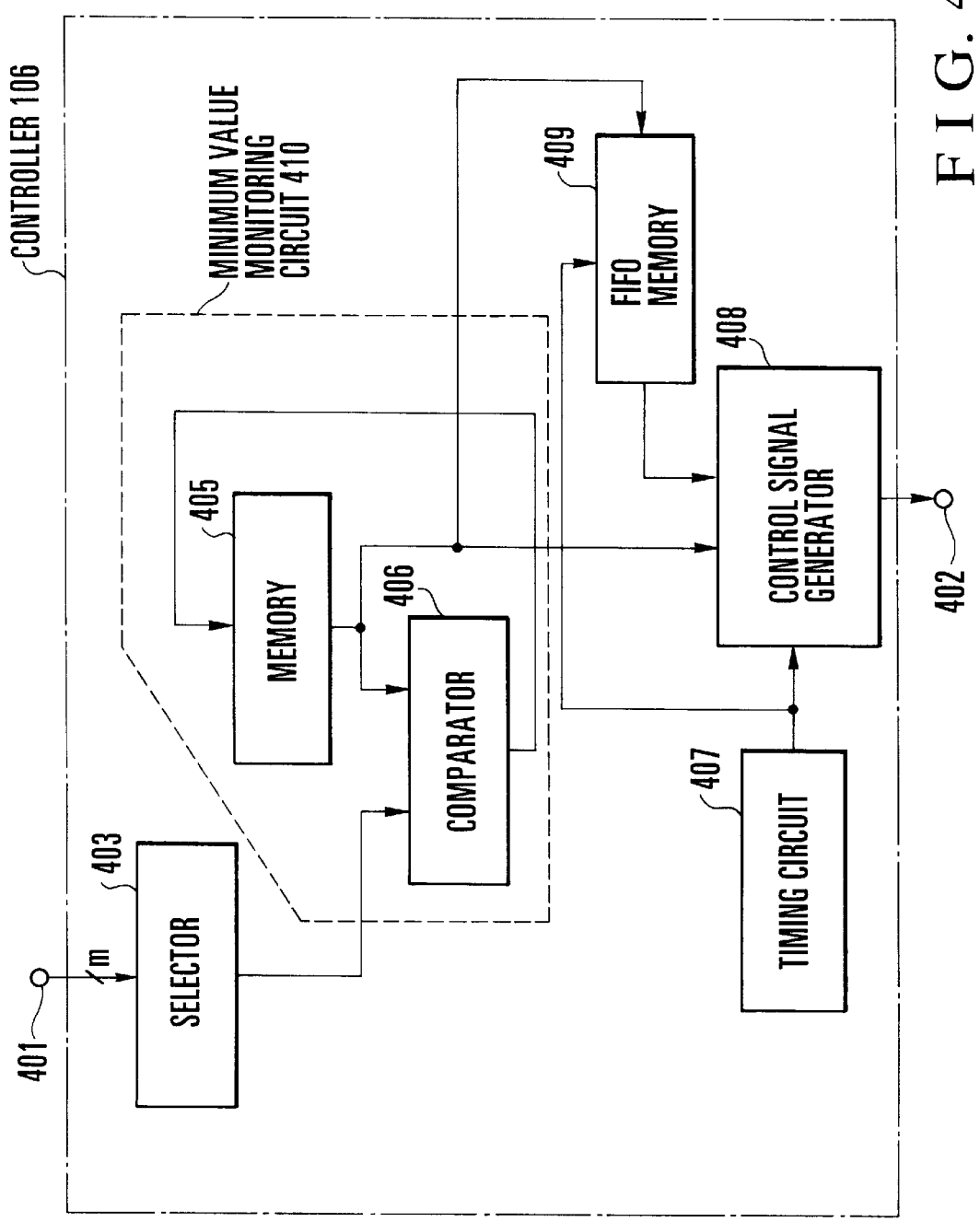
FIG. 4 is a block diagram showing an example of the arrangement of a controller in FIG. 1.

FIG. 4 shows an example of the controller 106 in FIG. 1. In FIG. 4, the controller 106 is constituted by an input terminal 401 for inputting the filter coefficient powers from the filter circuits $110_1$ to $110_m$, a selector 403 for selecting one signal from the m input signals, a minimum value monitoring circuit 410 made up of a memory 405 and a comparator 406 to monitor the minimum filter coefficient power and a corresponding block number, a timing circuit 407, a FIFO memory 409, a control signal generator 408 to generate a control signal for storing a block number having the minimum power at the end of a queue and making a block number at the front row effective at a certain timing, and an output terminal 402 for outputting the control signal from the control signal generation 408.

The operation of the adaptive filter having this arrangement will be explained. In FIG. 1, the controller 106 controls connection of the input signal blocks $109_1$ to $109_n$ and the filter circuits $110_1$ to $110_m$, by the matrix switch 105. At this time, since the n input signal blocks $109_1$ to $109_n$ are larger in number than the m filter circuits $110_1$ to $110_m$, the controller 106 determines, of the input signal blocks $109_1$ to $109_n$, effective blocks to be connected to the filter circuits $110_1$ to $110_m$ and ineffective blocks not to be connected.

The effective blocks of the input signal blocks $109_1$ to $109_n$ are subjected to adaptive filter processing by the filter circuits $110_1$ to $110_m$. Data of the ineffective blocks of the input signal blocks $109_1$ to $109_n$ are not used for filter processing.

The operation of the controller 106 will be explained. The controller 106 controls the matrix switch 105 so as to make the input signal blocks $109_1$ to $109_n$, corresponding to the "responding part" of an impulse response, effective. For this purpose, the controller 106 monitors the filter coefficient power values of the filter circuits $110_1$ to $110_m$ corresponding to the current effective blocks at a predetermined interval, and makes some of the input signal blocks $109_1$ to $109_n$ determined to be spaced apart from the "responding part" ineffective. Conversely, the controller 106 also preferentially makes some of the ineffective blocks of the input signal blocks $109_1$ to $109_n$ determined to be close to the "responding part" effective.

The operation of the controller 106 will be described in more detail with reference to FIG. 4. The controller 106 determines, of the effective blocks, a block having the minimum filter coefficient power stored in the memory 405 to be an ineffective block at a periodical timing based on an output from the timing circuit 407.

More specifically, the selector 403 selects one of the filter coefficient powers at a high-frequency The minimum value monitoring circuit (first ordering means) 410 compares the selected filter coefficient power with the current minimum value stored in the memory 405. If a block has a filter coefficient power smaller than the minimum value stored in the memory 405, the block number and filter coefficient power value of this block are stored in the memory 405.

Note that the block itself having the minimum filter coefficient power is not compared, and only the filter power value is updated.

The block number of a block selected from ineffective blocks to be made effective is stored in a queue, i.e., the FIFO memory (second ordering means) 409. At the timing of the timing circuit 407, the block number having the minimum filter coefficient power at that time as an output from the memory 405 is stored at the end of the queue in the FIFO memory 409. To make a block having a block number on the front row of the queue effective, the control signal generator 408 outputs a control signal representing a block to be switched from "effective" to "ineffective" and a block to be switched from "ineffective" to "effective". That is, the FIFO memory 409 sequentially stores the block numbers of blocks having been "ineffective", and outputs the block numbers of blocks to be made "effective" in the storage order.

The timing period of the timing circuit 407 suffices to be m time or more the selection period of the selector 403 so as to allow the controller 106 to select all the filter circuits $110_1$ to $110_m$ once.

Figure 5:
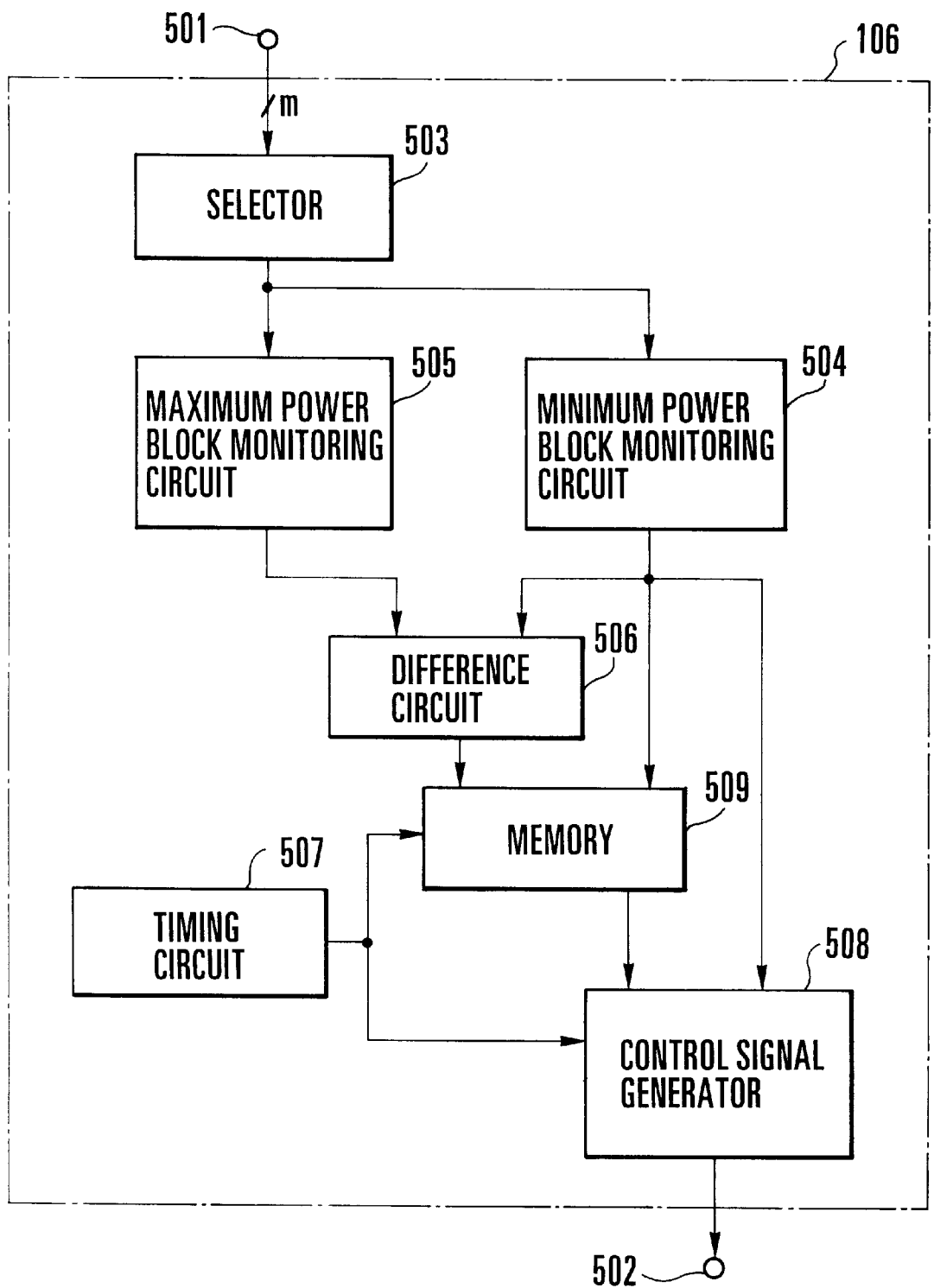
FIG. 5 is a block diagram showing another example of the arrangement of the controller in FIG. 1.
Figure 6:
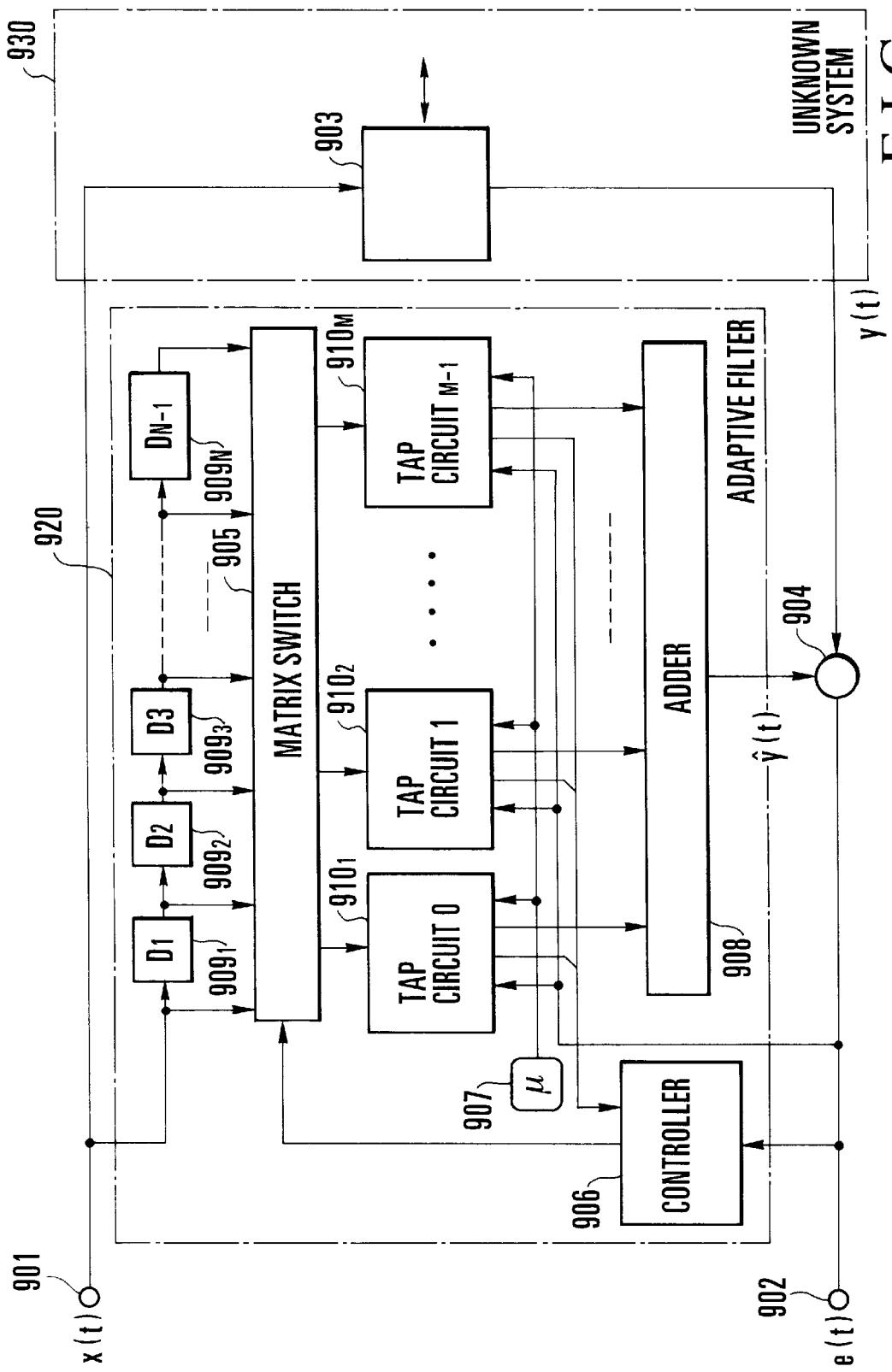
FIG. 6 is a block diagram showing the construction of an echo canceller system having a conventional adaptive filter.
Figure 7:
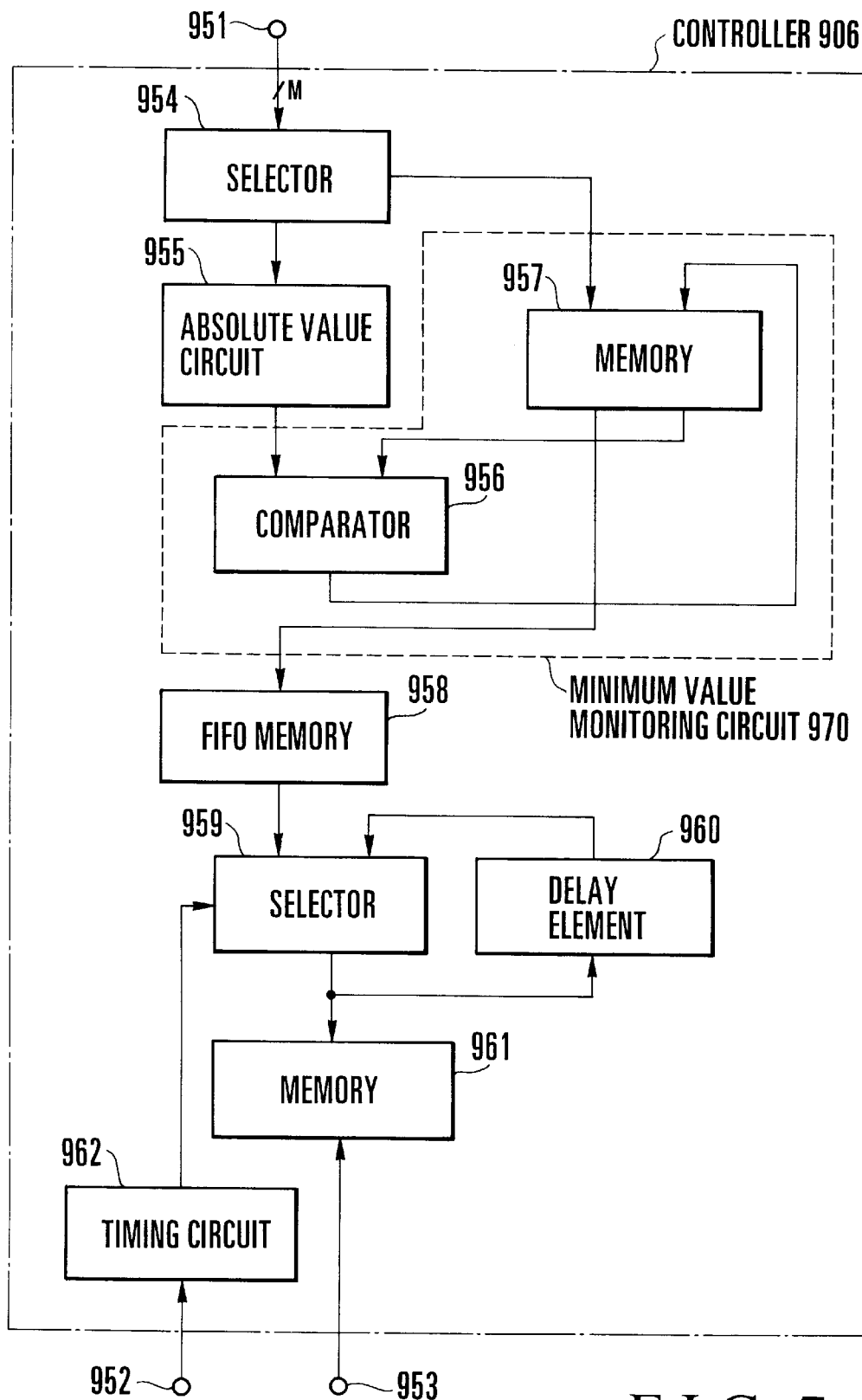
FIG. 7 is a block diagram showing a controller in FIG. 6.
Figure 8:
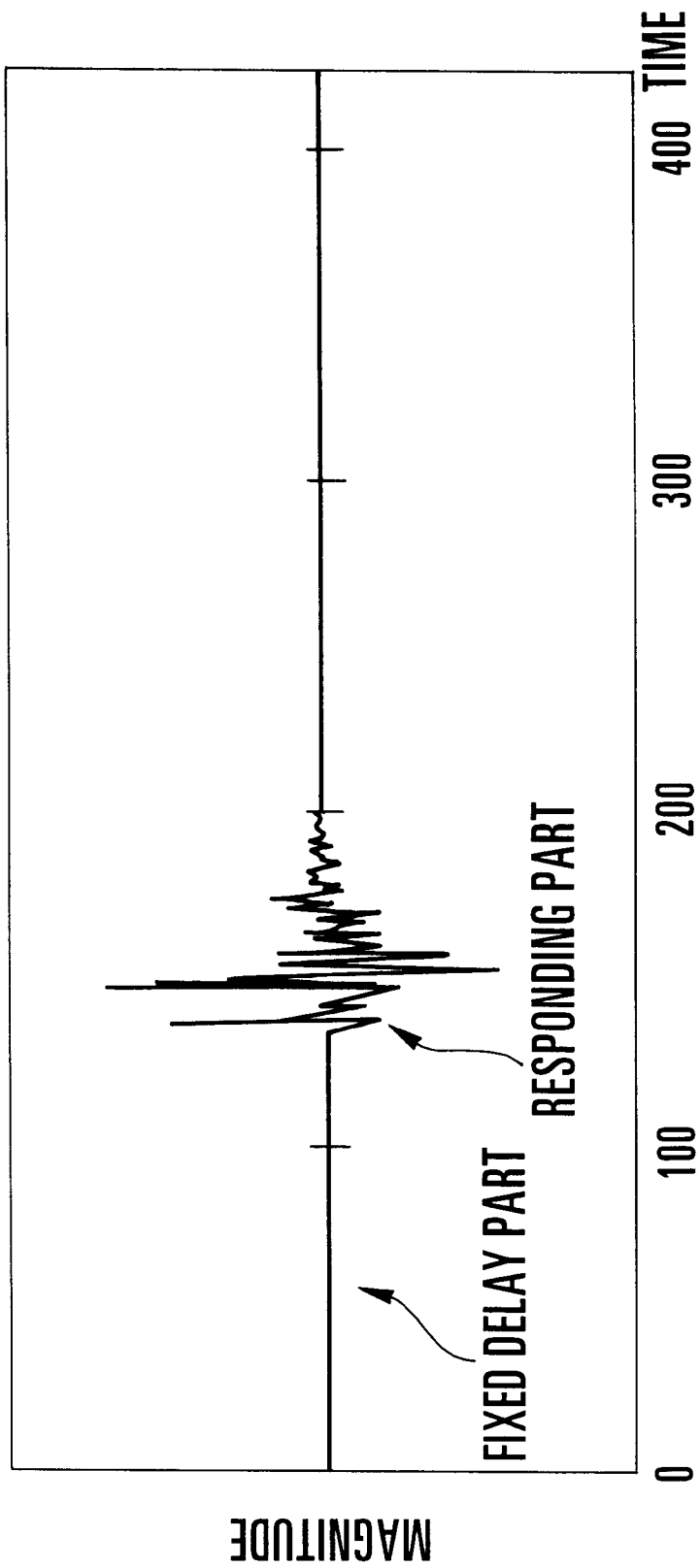
FIG. 8 is a graph showing an example of the impulse response of an echo signal.

FIG. 5 shows another example of the controller 106 in FIG. 1. In FIG. 5, the controller 106 is constituted by a selector 503 for selecting input signals 501, a maximum power block monitoring circuit 505 for monitoring whether the selected signal has the maximum value, a minimum power block monitoring circuit 504 for monitoring whether the selected signal has the minimum value, a difference circuit 506 for calculating a difference between the block numbers of the maximum and minimum power blocks, a timing circuit 507 for generating timings at a constant interval, a memory 509 for storing a standby time corresponding to an output from the difference circuit 506 and the block number of the minimum power block at the timing generated by the timing circuit 507, and outputting a block number having the minimum standby time, a control signal generator 508 for generating a control signal for the matrix switch 105 from the block number of the minimum power block output from the minimum power block monitoring circuit 504, and the block number with the minimum standby time output from the memory 509 at the timing generated by the timing circuit 507, and an output terminal 502 for outputting the generated control signal. The minimum power block monitoring circuit 504 has the same arrangement as that of the minimum value monitoring circuit 410 shown in FIG. 4.

In the controller shown in FIG. 5, a block monitored by the minimum power block monitoring circuit 504 to have the minimum power at a given time interval is determined to be made ineffective. The maximum power block monitoring circuit 505 monitors a block having the maximum power. In making the block having the minimum power ineffective at the timing of the timing circuit 507, the difference circuit 506 calculates a difference between the block number of the minimum power block and the block number of a maximum power block obtained by the maximum power block monitoring circuit 505. Based on this difference value, the standby time of the ineffective block is determined. The memory 509 stores the standby time and the block number in association with each other. At the same time, the memory 509 outputs the block number of an ineffective block having the minimum standby time.

The control signal generator 508 generates a connection control signal for switching the block number of an effective block having the minimum power to the block number of the ineffective block having the minimum standby time, and outputs the signal to the output terminal 502. In response to the connection control signal from the output terminal 502, the matrix switch 105 performs connection control for the effective and ineffective blocks.

As has been described above, according to the present invention, selection of effective and ineffective taps is performed in units of blocks each having k tap circuits. The matrix switch connects input signal blocks and filter circuits each having k tap circuits. With this processing, the connection control is reduced to 1/k.

Since the sum of the filter coefficient powers of each filter circuit is used as a comparison value in the controller, the comparison value is averaged, which enables temporal distributed processing, i.e., one process over a plurality of samples (d samples).

As a result, processing (calculation amount) for exchange determination of effective and ineffective taps is reduced to 1/k/d, compared to the conventional method of performing effective/ineffective switching in units of taps.

Using the averaged value as the comparison value eliminates any control error. Accordingly, the convergence time can be shortened.

What is claimed is:

1. An adaptive filter comprising:

n (where n is a positive integer) blocks for dividing a continuous string of a plurality of input signals into a plurality of n groups each made up of k (where k is a positive integer) signals;

m (where m is a positive integer) filter means for variably setting a filter coefficient on the basis of a reference signal, an error signal representing a difference between an adaptive filter output and an output from a system to be estimated, and a constant, and for outputting a calculation result of the set filter coefficient and the reference signal;

a matrix switch for selecting m of said n blocks to respectively connect said selected m blocks to said filter means, and outputting output signals of said selected m blocks as reference signals to said connected filter means;

addition means for calculating a sum of calculation results output from said filter means, and outputting the sum as a filter output; and control means for controlling a connection operation of said matrix switch on the basis of each filter coefficient set by said filter means.

2. A filter according to claim 1, wherein each of said n blocks comprises k delay elements cascade-connected to each other, and input signals to said delay elements are output in parallel to said matrix switch, and an output from said delay element on a last stage is output to a next block.

3. A filter according to claim 1, wherein each of said filter means comprises:

k multipliers for multiplying the respective k reference signals from said matrix switch by the respective k set filter coefficients;

an adder for calculating a sum of outputs from said multipliers to obtain a filter output;

k filter coefficient generators for variably setting the filter coefficient on the basis of the constant, the error signal representing the difference between the filter output and the output from the system to be estimated, and the reference signal from said matrix switch; and a filter coefficient power arithmetic circuit for calculating a sum of filter coefficient powers from outputs of said filter coefficient generators, and outputting the sum to said control means.

4. A filter according to claim 1, wherein said control means comprises:

first ordering means for performing ordering of changing a connected state to an unconnected state for said blocks connected to said filter means on the basis of filter coefficient powers output from said filter means;

second ordering means for performing ordering of changing an unconnected state to a connected state for remaining blocks not connected to said filter means; and control signal generation means for monitoring ordering information of said first and second ordering means at a predetermined time period, and generating a control signal for instructing said matrix switch to change a connection relationship between said blocks and said filter means on the basis of a monitoring result.

5. A filter according to claim 4, wherein said first ordering means comprises a minimum value monitoring circuit for detecting a block number of a block connected to said filter means that has a minimum output power value of all the filter coefficient powers output from said filter means at a predetermined time period, and outputting the detected block as a first block.

6. A filter according to claim 4, wherein said second ordering means comprises a first-in first-out memory for storing, at an end of a queue, a block number output from said first ordering means at the predetermined time period, and outputting a block number on a front row as a block number of a first block.

7. A filter according to claim 4, wherein said control means further comprises:

a selector for selecting the filter coefficient powers output from said filter means at a first period, and a timing circuit for outputting a timing signal having a second period not less than m times the first period of said selector to said second ordering means and said control signal generation means.

8. A filter according to claim 1, wherein said control means comprises:

a minimum power block monitoring circuit for detecting a block number of a block connected to said filter means that has a minimum output value of all the filter coefficient powers output from said filter means at a predetermined time period, and performing ordering;

a maximum power block monitoring circuit for detecting a block number of a block connected to said filter means that has a maximum value of all the filter coefficient powers output from said filter means at a predetermined time period, and performing ordering;

a difference circuit for calculating a difference between the block numbers detected by said maximum and minimum power block monitoring circuits;

a memory for storing an output from said difference circuit as a standby time together with the block number detected by said minimum power block monitoring circuit; and a control signal generator for generating, at a predetermined period, a control signal for instructing said matrix switch to change connection of said filter means from said block having the block number detected by said minimum power block monitoring circuit to a block having the block number having a shortest standby time output from said memory.

9. An adaptive filter comprising:

a plurality n of input dividers for dividing a continuous sequence of a plurality of input signals into a plurality k of signals for each of said input dividers;

each of said n input dividers further comprising:
k delay elements cascade-connected to each other, wherein signals input to each of said input dividers are output as a group in parallel to a matrix switch, and are output from each delay element within an input divider to the next delay element and an output from a last delay element in the input divider is output to the next input divider;

a plurality m of filter circuits;

a matrix switch for selecting m groups of k signals from said n groups of k signals to respectively connect said selected groups to said plurality of filter circuits, and outputting output signals of said selected m groups as reference signals to the plurality of filter circuits as k reference signals;

said filter circuits outputting a calculation to an addition circuit, each filter circuit further comprising:

k multipliers for multiplying the k reference signals by k variably set filter coefficients;

an adder for calculating a first sum of outputs from said multipliers to obtain a filter circuit output;

k filter coefficient generators for variably setting k respective filter coefficients as a function of the respective reference signals output from said matrix switch, an error signal representing the difference between an adaptive filter output and an output from a system to be estimated, and a constant; and a filter coefficient power arithmetic circuit for calculating a second sum of filter coefficient powers output from said filter coefficient generators, and for outputting the second sum to a controller;

an addition circuit for calculating a third sum of calculation results output from said filter circuits, and outputting the third sum as the adaptive filter output; and a controller for controlling a connection operation of said matrix switch based upon the respective filter coefficient powers output from said filter coefficient generators of each said filter circuit.

* * * * *